(12) United States Patent
Chang et al.

(10) Patent No.: US 11,175,597 B2
(45) Date of Patent: Nov. 16, 2021

(54) PELLICLE STRUCTURE FOR LITHOGRAPHY MASK

(71) Applicant: TAIWAN SEMICONDUCTOR MANUFACTURING CO., LTD., Hsinchu (TW)

(72) Inventors: Shih-Ming Chang, Hsinchu (TW); Chiu-Hsiang Chen, Hsinchu County (TW); Ru-Gun Liu, Zhubei (TW); Minfeng Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 79 days.

(21) Appl. No.: 16/697,138

(22) Filed: Nov. 26, 2019

(65) Prior Publication Data

US 2020/0174382 A1  Jun. 4, 2020

Related U.S. Application Data

(60) Provisional application No. 62/774,137, filed on Nov. 30, 2018.

(51) Int. Cl.
*G03F 7/20* (2006.01)
*G03F 1/64* (2012.01)

(52) U.S. Cl.
CPC ............ *G03F 7/70983* (2013.01); *G03F 1/64* (2013.01); *G03F 7/70033* (2013.01)

(58) Field of Classification Search
CPC .. G03F 1/142; G03F 7/70983; G03F 7/70033; G03F 7/702
See application file for complete search history.

(56) References Cited

U.S. PATENT DOCUMENTS

| 10,488,766 | B2 | 11/2019 | Chen et al. | |
| 2006/0160031 | A1* | 7/2006 | Wurm | G21K 1/10 430/322 |
| 2008/0152873 | A1* | 6/2008 | Okoroanyanwu | B82Y 10/00 428/195.1 |
| 2008/0158535 | A1* | 7/2008 | Goldstein | G03F 1/62 355/67 |
| 2008/0246939 | A1* | 10/2008 | Yonekawa | B82Y 40/00 355/53 |
| 2017/0146902 | A1* | 5/2017 | Lairson | G03F 7/16 |

* cited by examiner

*Primary Examiner* — Steven Whitesell Gordon
(74) *Attorney, Agent, or Firm* — McDermott Will & Emery LLP

(57) ABSTRACT

A lithography patterning system includes a reticle having patterned features, a pellicle having a plurality of openings, a radiation source configured for emitting radiation to reflect and/or project the patterned features, and one or more mirrors configured for guiding reflected and/or projected patterned features onto a wafer. The pellicle is configured to protect the reticle against particles and floating contaminants. The plurality of openings include between 5% and 99.9% of lateral surface area of the pellicle. The pellicle can be attached to the reticle on a side of the patterned features, placed beside an optical path between the radiation source and the wafer, or placed in an optical path between mirrors and the radiation source. The plurality of openings in the pellicle are formed by a plurality of bar shaped materials, or formed in a honey comb structure or a mesh structure.

20 Claims, 12 Drawing Sheets

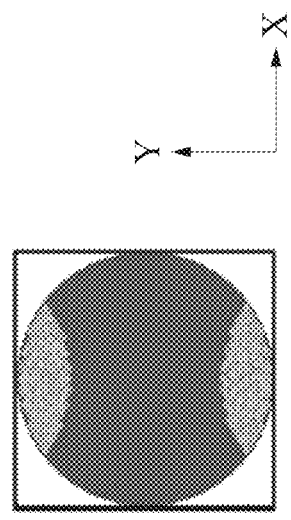
FIG. 4B
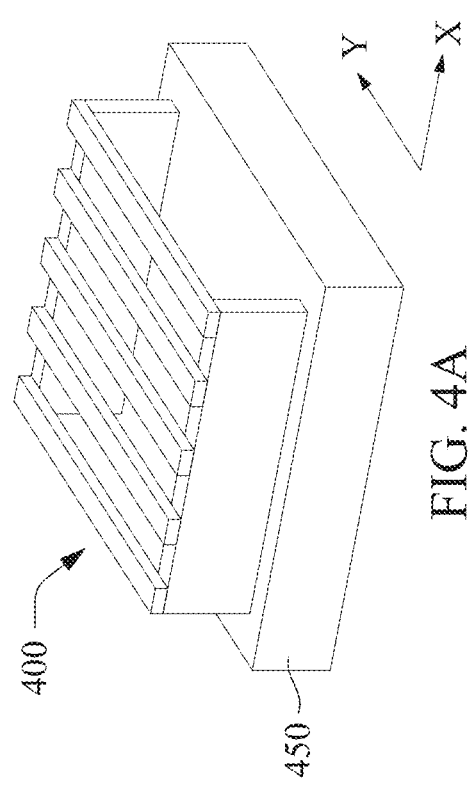
FIG. 4A
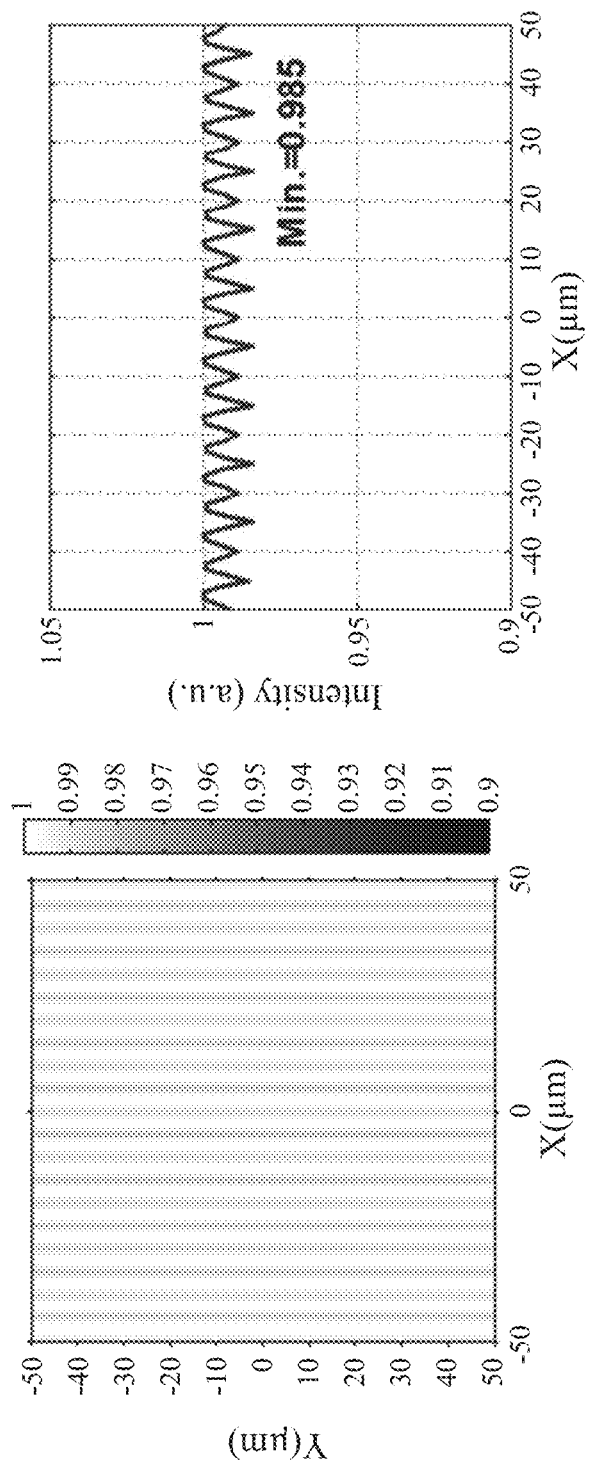
FIG. 4D
FIG. 4C

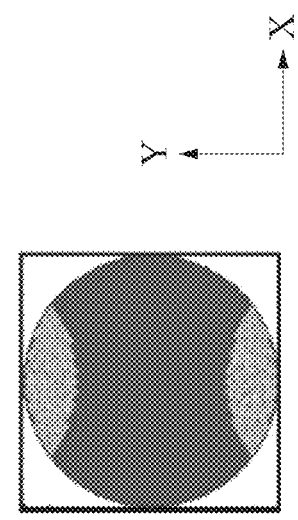
FIG. 5B
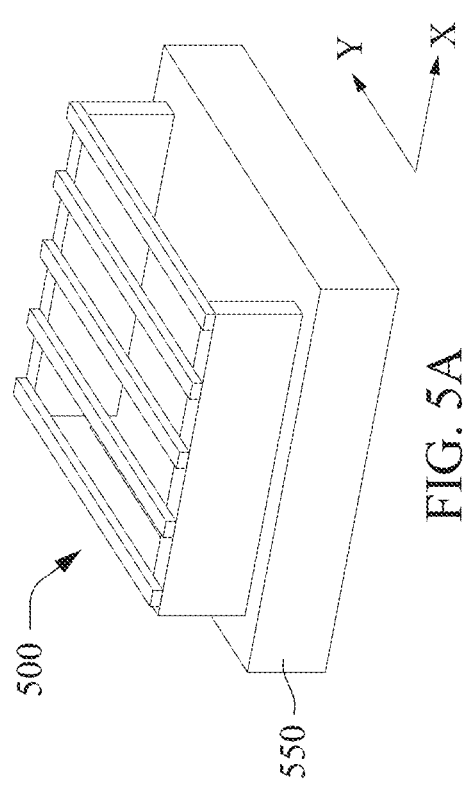
FIG. 5A
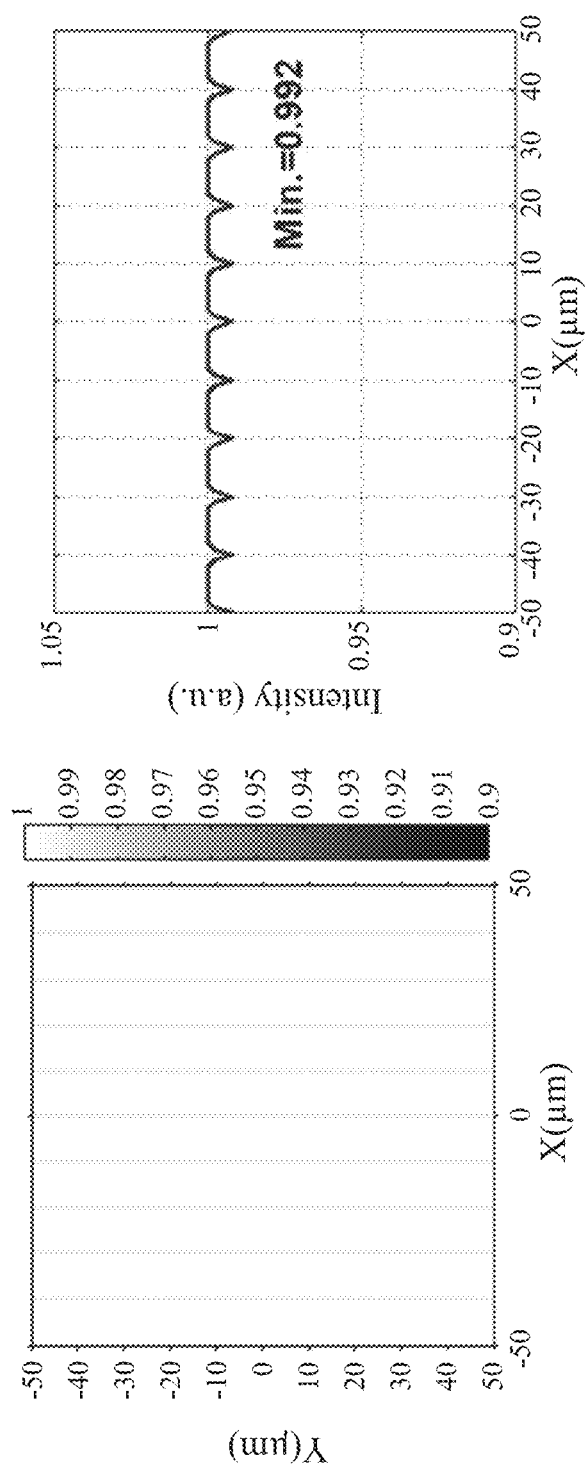
FIG. 5D
FIG. 5C

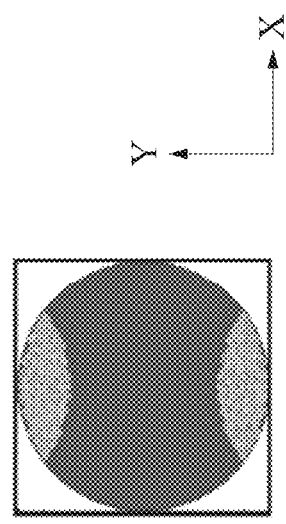
FIG. 7B
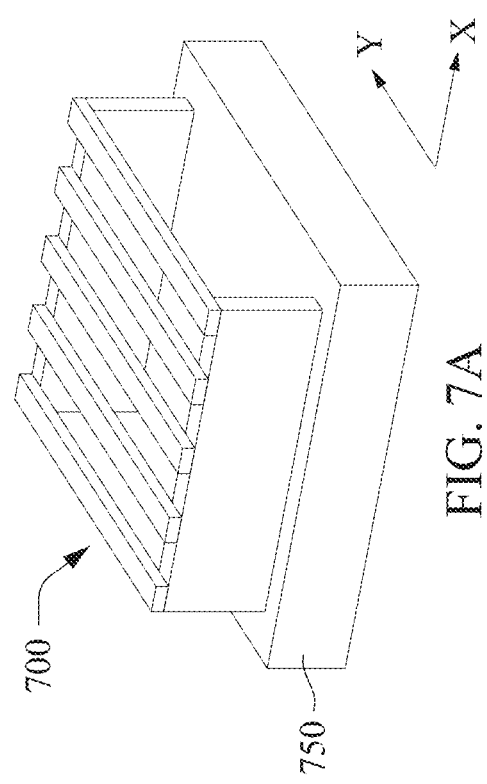
FIG. 7A
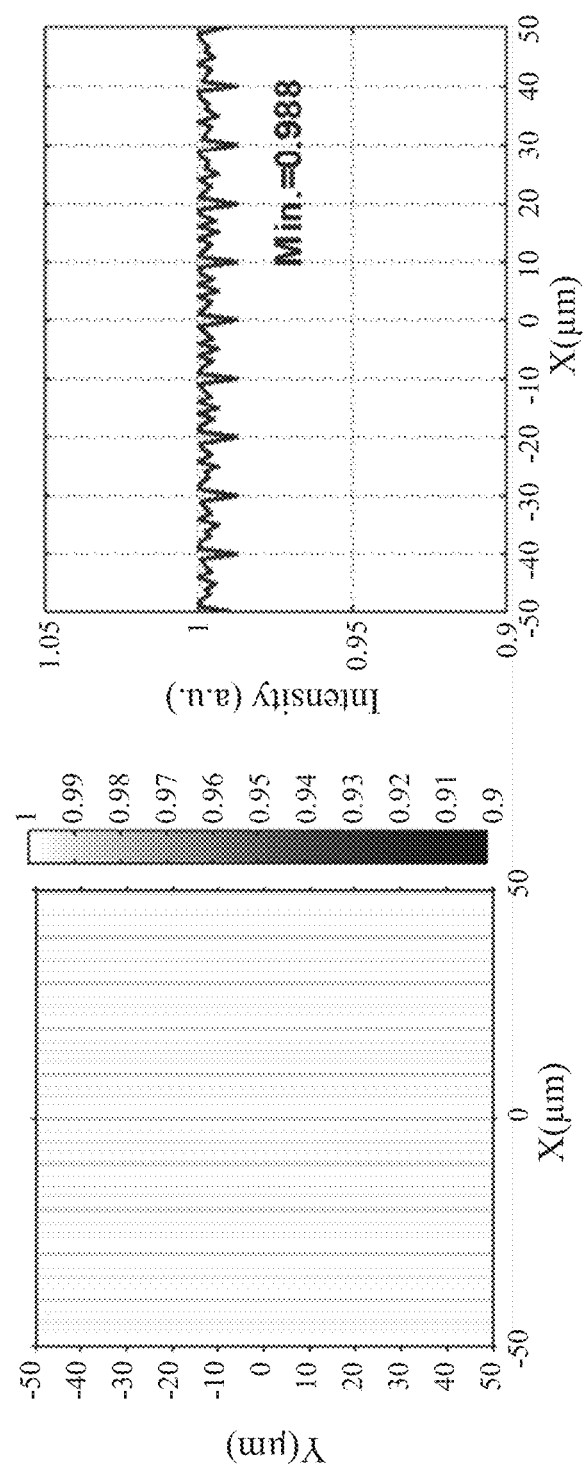
FIG. 7D
FIG. 7C

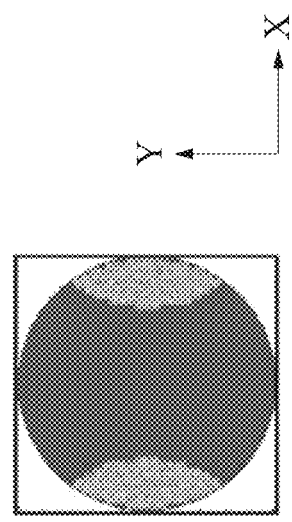
FIG. 8B
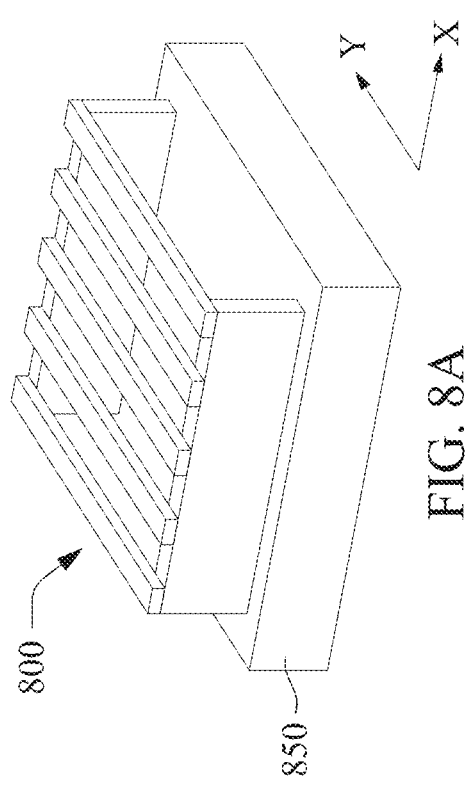
FIG. 8A
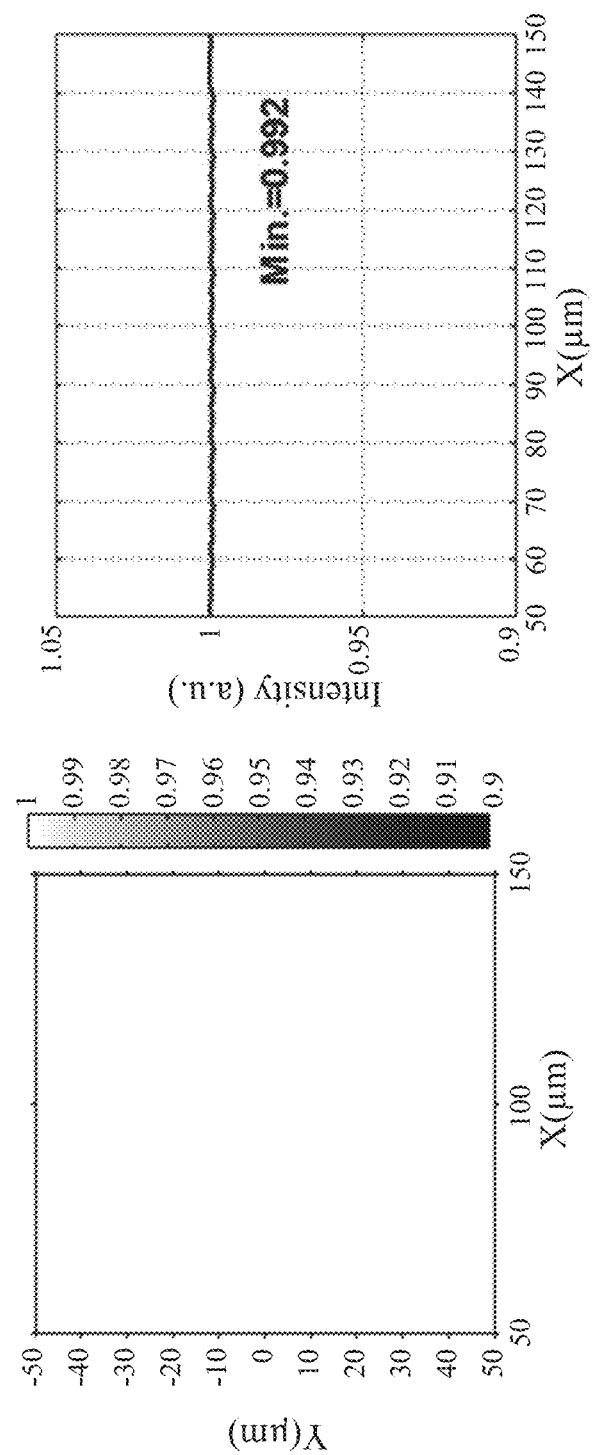
FIG. 8D
FIG. 8C

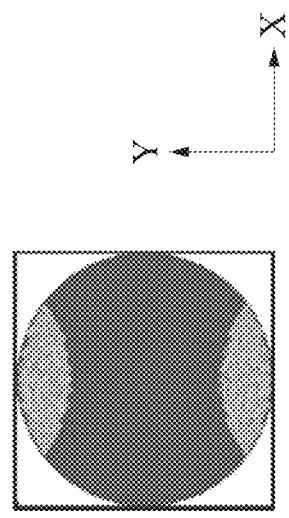
FIG. 9B
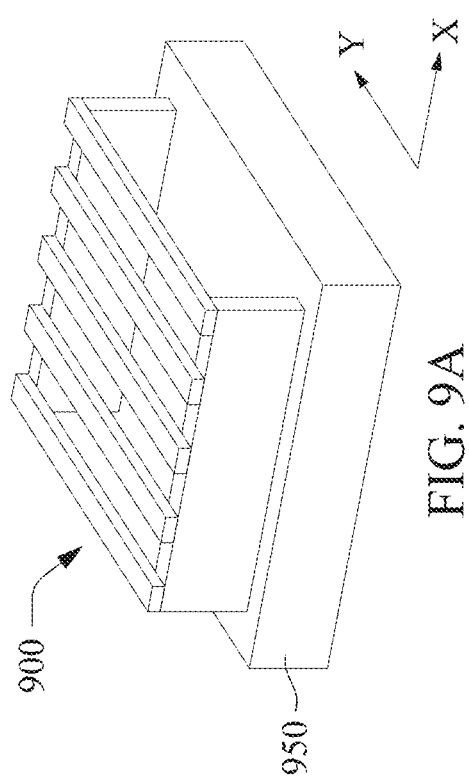
FIG. 9A
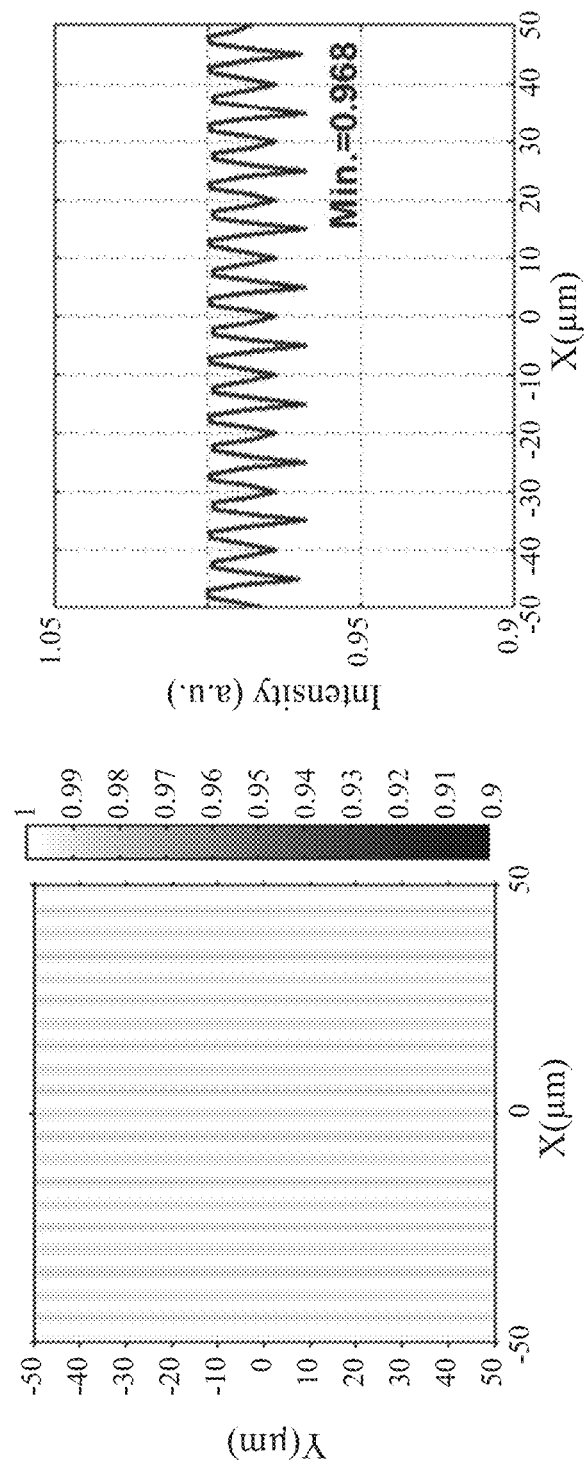
FIG. 9D
FIG. 9C

PELLICLE STRUCTURE FOR LITHOGRAPHY MASK

CROSS-REFERENCE OF RELATED APPLICATIONS

This application claims priority to Provisional Application No. 62/774,137, entitled "Sparse Pellicle Structure For Lithography Mask," filed on Nov. 30, 2018, the entire disclosure of which is incorporated herein by reference.

BACKGROUND

For modern lithography tools, such as Deep Ultra-Violet (DUV) lithography, a pellicle is used to protect a reticle against falling particles and floating contaminants. The pellicle has a transparent membrane for radiation transmission and is typically attached to a frame, which is positioned a certain distance from the pattern side of the reticle. Since the membrane is spaced from the pattern side, which is the imaging surface, any particle on the membrane of the pellicle will not be on the focal plane, and thus will not result in a clear image on a wafer. For Extreme Ultra-Violet (EUV) lithography operating at a wavelength around 13.5 nm, it is challenging to find a suitable material that can be used as a transparent pellicle. A material currently used for a transparent pellicle consumes about 30% of the energy of the EUV radiation when it passes through the pellicle. Therefore, there is an urgent need for an improved pellicle that can be used in EUV lithography.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 4A illustrates a pellicle according to an embodiment of the disclosure.

FIG. 4B illustrates a light source according to an embodiment of the disclosure.

FIG. 4C is a simulation plot indicating intensity of the transmitted light of the pellicle based on the image of the pellicle on a wafer.

FIG. 4D is another simulation plot indicating the intensity of the transmitted light of the pellicle based on the image of the pellicle on a wafer.

FIG. 5A illustrates a pellicle according to an embodiment of the disclosure.

FIG. 5B illustrates a light source according to an embodiment of the disclosure.

FIG. 5C is a simulation plot indicating intensity of the transmitted light of the pellicle based on the image of the pellicle on a wafer.

FIG. 5D is another simulation plot indicating the intensity of the transmitted light of the pellicle based on the image of the pellicle on a wafer.

FIG. 7A illustrates a pellicle according to an embodiment of the disclosure.

FIG. 7B illustrates a light source according to an embodiment of the disclosure.

FIG. 7C is a simulation plot indicating intensity of the transmitted light of the pellicle based on the image of the pellicle on a wafer.

FIG. 7D is another simulation plot indicating the intensity of the transmitted light of the pellicle based on the image of the pellicle on a wafer.

FIG. 8A illustrates a pellicle according to an embodiment of the disclosure.

FIG. 8B illustrates a light source according to an embodiment of the disclosure.

FIG. 8C is a simulation plot indicating intensity of the transmitted light of the pellicle based on the image of the pellicle on a wafer.

FIG. 8D is another simulation plot indicating the intensity of the transmitted light of the pellicle based on the image of the pellicle on a wafer.

FIG. 9A illustrates a pellicle according to an embodiment of the disclosure.

FIG. 9B illustrates a light source according to an embodiment of the disclosure.

FIG. 9C is a simulation plot indicating intensity of the transmitted light of the pellicle based on the image of the pellicle on a wafer.

FIG. 9D is another simulation plot indicating the intensity of the transmitted light of the pellicle based on the image of the pellicle on a wafer.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Embodiments disclosed herein are directed to pellicles that protect the pattern side of a lithography mask from falling particles and floating contaminants. The disclosed pellicle (also referred to herein as a sparse pellicle, a pellicle structure, or simply a structure) maintains a relatively higher transmissive rate of the EUV radiation. In some embodiments as disclosed herein, the pellicle is formed from a material that includes gaps, spacing, or generally referred to herein as openings, as opposed to existing pellicle structures that include a film or a membrane stretched over the reticle. In some embodiments, a portion or a whole of the pellicle is electrically charged or magnetized to improve collection of particles and contaminants. In various embodiments, the sparse pellicle is configured to provide an improved transmissive rate for EUV radiation having a wavelength of around 13.5 nm, or in general from about 10 nm to about 450 nm. In addition to being used as a pellicle (as part of the lithographic mask), the pellicle can be used in an imaging system (e.g., in an optical system) of the EUV system to collect floating contaminants in the optical path in some embodiments or beside the optical path in other embodiments.

Figure 1:
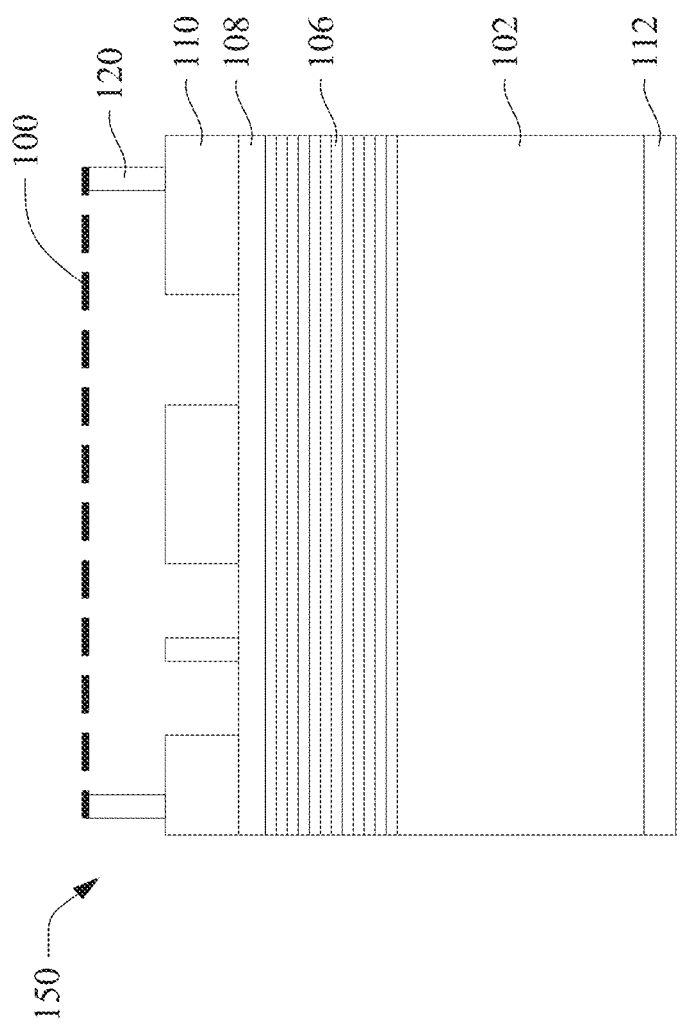
FIG. 1 schematically illustrates a pellicle disposed on a lithographic mask according to an embodiment of the disclosure.

FIG. 1A schematically illustrates a pellicle 100 disposed on a lithographic mask 150 according to an embodiment of the disclosure. The lithographic mask 150 includes a substrate 102 disposed over a blind layer 112. In some embodiments, the blind layer 112 is a CrN layer having a thickness between 50 nm and 300 nm. The lithographic mask 150 also includes a plurality of reflective multiple layers (ML) 106 disposed on the substrate 102. In some embodiments, the ML 106 includes a plurality of layer pairs, such as molybdenum-silicon (Mo/Si) layer pairs (e.g., a layer of molybdenum above or below a layer of silicon in each layer pair). In some embodiments, the ML 106 has a thickness between 250 nm and 350 nm. In some embodiments, the ML 106 includes molybdenum-beryllium (Mo/Be) layer pairs, or other suitable materials that are configurable to highly reflect the EUV light. The lithographic mask 150 also includes a capping layer 108, such as a ruthenium (Ru) layer, that is disposed on the ML 106 for protection. The lithographic mask 150 also includes an absorption stack 110 that includes a bilayer of TaBO, TaBN, TaNO, or TaN in some embodiments. The bilayer of the absorption stack 110 is disposed on the capping layer 108. The absorption stack 110 is patterned to form patterned features. The lithographic mask 150 also includes a frame 120 for supporting the pellicle 100. The frame 120 is positioned over the absorption stack 110. The pellicle 100 is positioned at a distance between 1 mm and 3 mm away from the absorption stack 110 via the frame 120 in some embodiments. The frame 120 has a height between 1 mm and 3 mm in some embodiments.

Figures 2A, 2B, 2C:
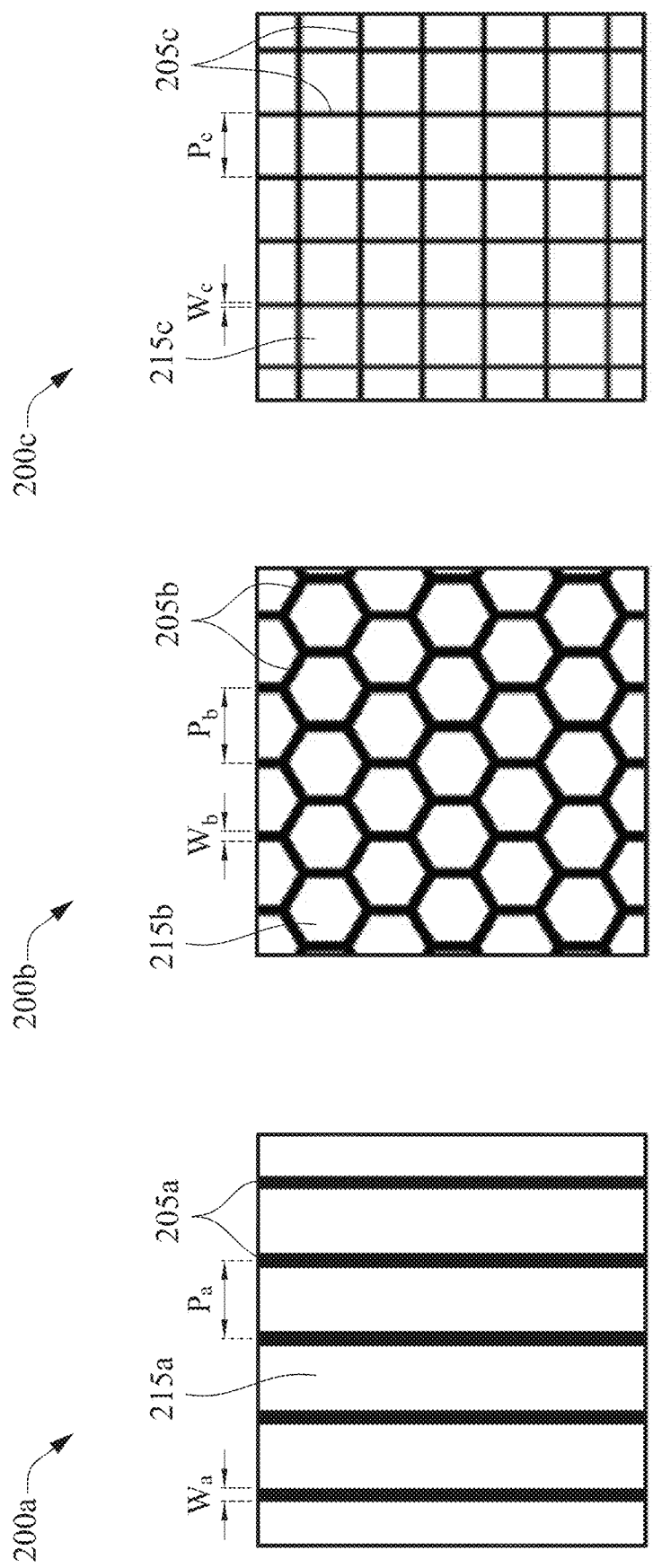
FIGS. 2A, 2B, and 2C illustrate example embodiments of a pellicle, according to various embodiments of the disclosure.

FIGS. 2A, 2B, and 2C illustrate various embodiments of a pellicle according to the disclosure. FIG. 2A schematically illustrates a pellicle 200a that includes a plurality of bar shape materials 205a. The pellicle 200a has a thickness between about 10 nm and about 100 µm. The bar shape materials 205a have a width $W_a$ between about 1 nm and about 1 µm, and a pitch $P_a$ between about 1 µm and about 100 µm. In some embodiments, the width $W_a$ is between about 1 nm and about 100 nm, between about 10 nm and about 1 µm, or between about 10 nm and about 100 nm, inclusive of any range of width values therebetween. In some embodiments, the pitch $P_a$ is between about 1 µm and about 80 µm, between about 1 µm and about 50 µm, or between about 10 µm and about 100 µm, inclusive of any range of pitch values therebetween.

As show in FIG. 2A, the pellicle 200a includes a plurality of openings 215a formed by the plurality of bar shape materials 205a. The plurality of openings 215a include between about 5% and about 99.9% of lateral surface area of the pellicle 200a. In some embodiments, the plurality of openings 215a include between about 5% and about 99.9%, between about 5% and about 99%, between about 10% and about 98%, between about 10% and about 95%, between about 20% and about 90%, or between about 25% and about 75% of lateral surface area of the pellicle 200a, inclusive of any ranges of lateral surface area therebetween.

FIG. 2B schematically illustrates a pellicle 200b that includes a honey comb structure 205b. The pellicle 200b has a thickness between about 10 nm and about 100 µm. As shown in FIG. 2B, the honey comb structure 205b has a width $W_b$ between about 1 nm and about 1 µm, and a pitch $P_b$ (a distance across parallel sides) between about 1 µm and about 100 µm. In some embodiments, the width $W_b$ is between about 1 nm and about 100 nm, between about 10 nm and about 1 µm, or between about 10 nm and about 100 nm, inclusive of any range of width values therebetween. In some embodiments, the pitch $P_b$ is between about 1 µm and about 80 µm, between about 1 µm and about 50 µm, or between about 10 µm and about 100 µm, inclusive of any range of pitch values therebetween.

As shown in FIG. 2B, the honey comb structure 205b has a plurality of openings 215b. The plurality of openings 215b include between about 5% and about 99.9% of lateral surface area of the pellicle 200b. In some embodiments, the plurality of openings 215b include between about 5% and about 99.9%, between about 5% and about 99%, between about 10% and about 98%, between about 10% and about 95%, between about 20% and about 90%, or between about 25% and about 75% of lateral surface area of the pellicle 200b, inclusive of any ranges of lateral surface area therebetween.

FIG. 2C schematically illustrates a pellicle 200c that includes a mesh structure 205c that includes square openings. The pellicle 200c has a thickness between about 10 nm and about 100 µm. In some embodiments, the mesh structure 205c includes a plurality of openings in any shape or form, including but not limited to, circular, oval, angular shape openings. The mesh structure 205c has a width $W_c$ between about 1 nm and about 1 µm, and a pitch $P_c$ between about 1 µm and about 100 µm. In some embodiments, the width $W_c$ is between about 1 nm and about 100 nm, between about 10 nm and about 1 µm, or between about 10 nm and about 100 nm, inclusive of any range of width values therebetween. In some embodiments, the pitch $P_c$ is between about 1 µm and about 80 µm, between about 1 µm and about 50 µm, or between about 10 µm and about 100 µm, inclusive of any range of pitch values therebetween. As shown in FIG. 2C, the pitch $P_c$ is measured in both horizontal and vertical directions, in some embodiments.

As show in FIG. 2C, the pellicle 200c includes a plurality of openings 215c. The plurality of openings 215c include between about 5% and about 99.9% of lateral surface area of the pellicle 200c. In some embodiments, the plurality of openings 215c include between about 5% and about 99.9%, between about 5% and about 99%, between about 10% and about 98%, between about 10% and about 95%, between about 20% and about 90%, or between about 25% and about 75% of lateral surface area of the pellicle 200c, inclusive of any ranges of lateral surface area therebetween.

Figure 3A:
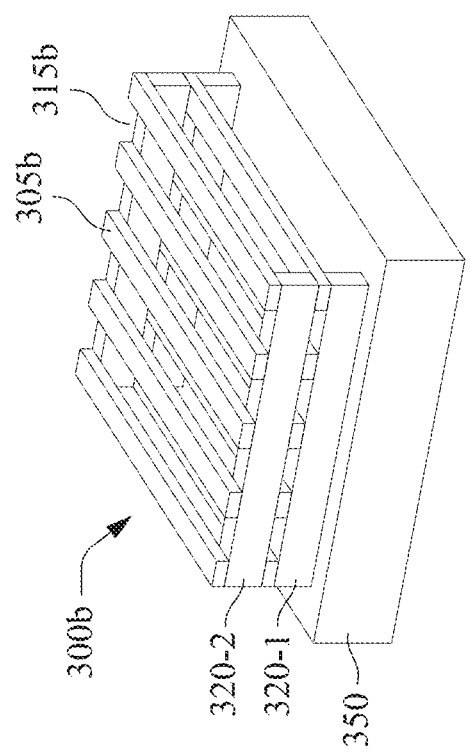
FIGS. 3A, 3B, 3C, and 3D illustrate different configurations of a pellicle disposed on a reticle, according to various embodiments of the disclosure.

FIGS. 3A, 3B, 3C, and 3D illustrate different configurations of a pellicle disposed over a reticle, according to various embodiments of the disclosure. FIG. 3A schematically illustrates a pellicle 300a that is supported by a frame 320 disposed on a reticle 350. The pellicle 300a is identical or substantially similar to the pellicles 200a, 200b, or 200c in FIGS. 2A, 2B, and 2C, respectively. The reticle 350 is identical or substantially similar to the lithographic mask 150 as shown and described with respect to FIG. 1. The pellicle 300a has a thickness between about 10 nm and about 100 µm. The frame 320 has a height D of about 1 mm to about 10 mm, and hence the pellicle 300a is disposed about 1 mm to about 3 mm away from the surface of the reticle 350.

As shown in FIG. 3A, the pellicle 300a includes a plurality of openings 315a formed by a plurality of bar shape materials 305a. The plurality of openings 315a include between about 5% and about 99.9% of lateral surface area of the pellicle 300a. As shown in FIG. 3A, the plurality of openings 315a include between about 5% and about 99.9%, between about 5% and about 99%, between about 10% and about 98%, between about 10% and about 95%, between about 20% and about 90%, or between about 25% and about 75% of lateral surface area of the pellicle 300a, inclusive of any ranges of lateral surface area therebetween.

Figure 3B:
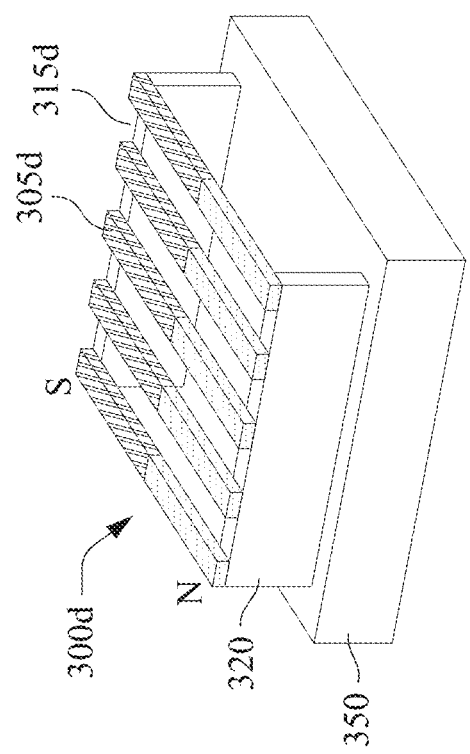

FIG. 3B schematically illustrates a multilayered pellicle 300b that includes two layers of the pellicle 300b supported by two frames 320-1 and 320-2 stacked on the reticle 350. Each of the layers of pellicle 300b is identical or substantially similar to the pellicles 200a, 200b, or 200c of FIG. 2A, 2B, or 2C. Each of the layers of pellicle 300b has a thickness between about 10 nm and about 100 µm. Each of the two frames 320-1 and 320-2 has a height of about 1 mm to about 10 mm, and hence the first layer of the multilayered pellicle 300b is disposed about 1 mm to about 3 mm away from the reticle 350 and the second layer of the multilayered pellicle 300b is disposed about 2 mm to about 20 mm away from the reticle 350.

As shown in FIG. 3B, the multilayered pellicle 300b includes a plurality of openings 315b formed by a plurality of bar shape materials 305b in each layer of the pellicle 300b. The plurality of openings 315b in each of the layer of the multilayered 300b include between about 5% and about 99.9% of lateral surface area of the layer. As shown in FIG. 3B, the plurality of openings 315b in each of the layer of the multilayered 300b include between about 5% and about 99.9%, between about 5% and about 99%, between about 10% and about 98%, between about 10% and about 95%, between about 20% and about 90%, or between about 25% and about 75% of lateral surface area of the pellicle 300b, inclusive of any ranges of lateral surface area therebetween.

In some embodiments, each layer of the pellicle 300b of the multilayered pellicle 300b includes the same material and the same structural configuration. The configuration includes, for example, percentage of lateral surface area that comprise the openings, pitch, width and thickness of the pellicle, etc. In some embodiments, each layer of the pellicle 300b of the multilayered pellicle 300b includes the same material but have different structural configurations. In some embodiments, each layer of the pellicle 300b of the multilayered pellicle 300b includes different material but have the same structural configuration. In some embodiments, each layer of the pellicle 300b of the multilayered pellicle 300b includes a different material and have different structural configurations. Each individual layer the pellicle 300b of the multilayered pellicle 300b can be made of any material with a k value that is low enough to maintain high transmission.

As shown in FIG. 3B, the two layers of the pellicle 300b are positioned so that the plurality of bar shaped materials 305b in the two layers of the multilayered pellicle 300b are parallel. In some embodiments, the relative orientation of the bar shaped materials 305b in the two layers are perpendicular to each other.

Figure 3C:
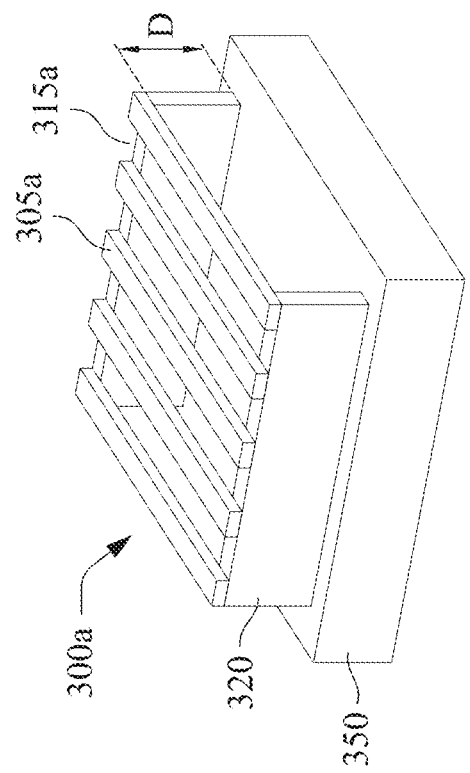

FIG. 3C schematically illustrates a pellicle 300c that is supported by a frame 320 disposed on the reticle 350. The pellicle 300c is identical or substantially similar to the pellicles 200a, 200b, or 200c of FIG. 2A, 2B, or 2C. The pellicle 300c includes a plurality of openings 315c formed by a plurality of bar shaped materials 305c. The pellicle 300c has a thickness between about 10 nm and about 100 µm. The plurality of bar shaped materials 305c have a width between about 1 nm and about 1 µm, and a pitch between about 1 µm and about 100 µm. In some embodiments, a portion or a whole of the plurality of bar shaped materials 305c are electrically charged to improve collection of particles and contaminants. As shown in FIG. 3C, a voltage is applied across alternating bar shaped materials 305c (indicated as V+ and V−) to trap the particles and contaminants. The voltage can be supplied in direct current (DC) or alternating current (AC). Upon application of the voltage, an electric field is generated across alternating bar shaped materials 305c and as a result, charged particles and contaminants are captured by the pellicle 300c.

Figure 3D:
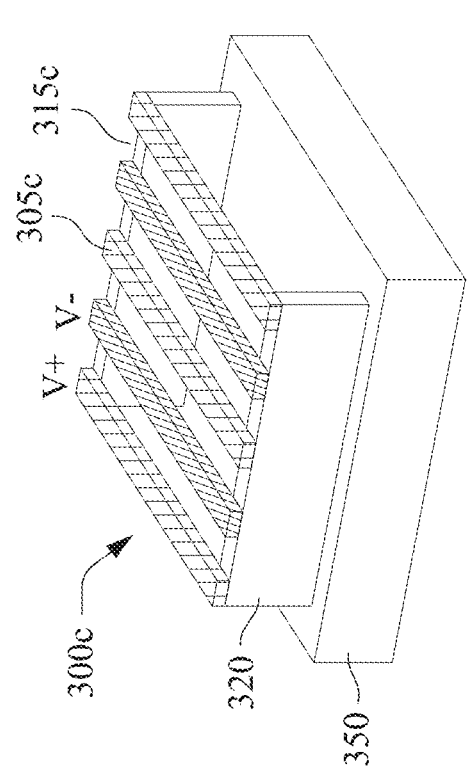

FIG. 3D schematically illustrates a pellicle 300d that is supported by the frame 320 disposed on the reticle 350. The pellicle 300d is identical or substantially similar to the pellicles 200a, 200b, or 200c of FIG. 2A, 2B, or 2C. The pellicle 300d includes a plurality of openings 315d formed by a plurality of bar shaped materials 305d. The pellicle 300d has a thickness between about 10 nm and about 100 µm. The plurality of bar shaped materials 305d have a width between about 1 nm and about 1 µm, and a pitch between about 1 µm and about 100 µm. In some embodiments, a portion or a whole of the plurality of the bar shaped materials 305d is magnetized to improve collection of particles and contaminants. For example, as shown in FIG. 3D, each of the bar shaped materials in the plurality of bar shaped materials 305d are magnetized to have the south pole of a magnetic field on one end and the north pole of the magnetic field on the other end. In some embodiments, the polarity of the magnetic field is alternated between adjacent bar shaped materials 305d.

In some embodiments, the pellicles 200a, 200b, 200c, 300a, 300c, and 300d are configured in a stacked configuration similar to the multilayered pellicle 300b as shown in FIG. 3B. In some embodiments, the pellicles 300a, 300b, 300c, and 300d are configured using the honey comb structure 200b of FIG. 2B or the mesh structure 200c of FIG. 2C, or any other shape or form of openings. In some embodiments, some portions of the honey comb structure 200b (or mesh structure 200c) are provided with positive polarity and other portions are provided with negative polarity, as shown in FIG. 3C. In some embodiments, some portions of the honey comb structure 200b (or mesh structure 200c) are magnetized to have the north pole and other portions are magnetized to have the south pole of the magnetic field.

FIG. 4A illustrates a pellicle 400 disposed on a reticle 450, according to an embodiment of the disclosure. The pellicle 400 shown in FIG. 4A has a width of 100 nm, a pitch of 10 μm, and is disposed 1.5 mm away from the surface of the reticle 450. FIG. 4B illustrates a light source having a shape, such as a Y-oriented dipole. FIG. 4C is a simulation plot indicating the intensity of the transmitted light of the pellicle 400 as a function of lateral positions x and y based on the image of the pellicle on a wafer. The intensity of the transmitted light of the pellicle 400 is shown as intensity in gray-scale. FIG. 4D is another simulation plot indicating the intensity of the transmitted light of the pellicle 400 as a function of lateral position x.

FIG. 5A illustrates a pellicle 500 disposed on a reticle 550, according to an embodiment of the disclosure. The pellicle 500 shown in FIG. 5A has a width of 10 nm, a pitch of 10 μm, and is disposed 1.5 mm away from the surface of the reticle 550. FIG. 5B illustrates a light source having a shape, such as a Y-oriented dipole. FIG. 5C is a simulation plot indicating the intensity of the transmitted light of the pellicle 500 as a function of the lateral positions x and y based on the image of the pellicle on a wafer. The transmission rate of the pellicle 500 is shown as the intensity in gray-scale. FIG. 5D is another simulation plot indicating the intensity of the transmitted light of the pellicle 500 as a function of the lateral position x.

Figure 6B:
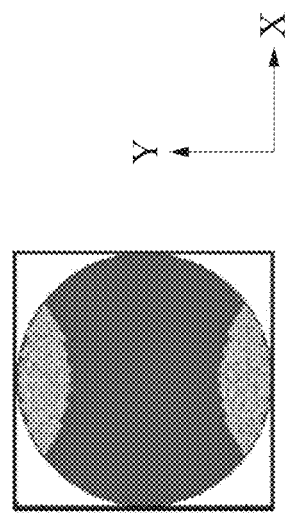
FIG. 6B illustrates a light source according to an embodiment of the disclosure.
Figure 6A:
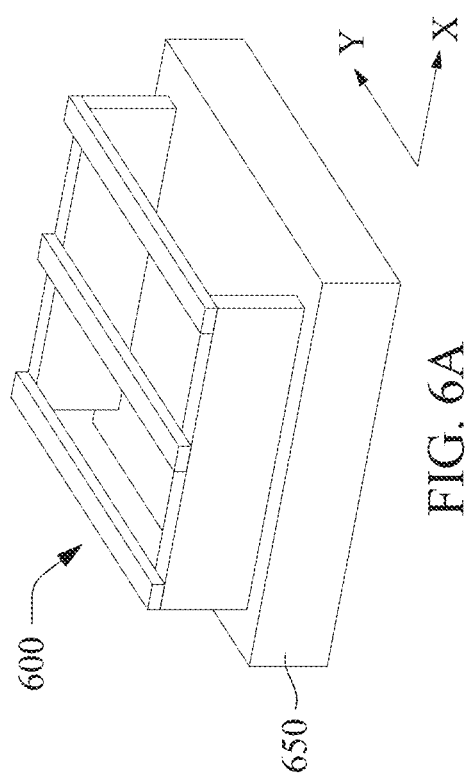
FIG. 6A illustrates a pellicle according to an embodiment of the disclosure.
Figure 6D:
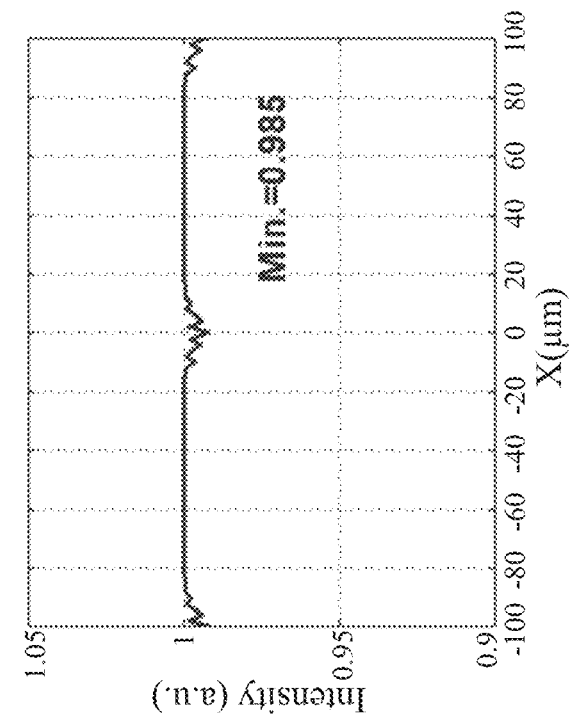
FIG. 6D is another simulation plot indicating the intensity of the transmitted light of the pellicle based on the image of the pellicle on a wafer.
Figure 6C:
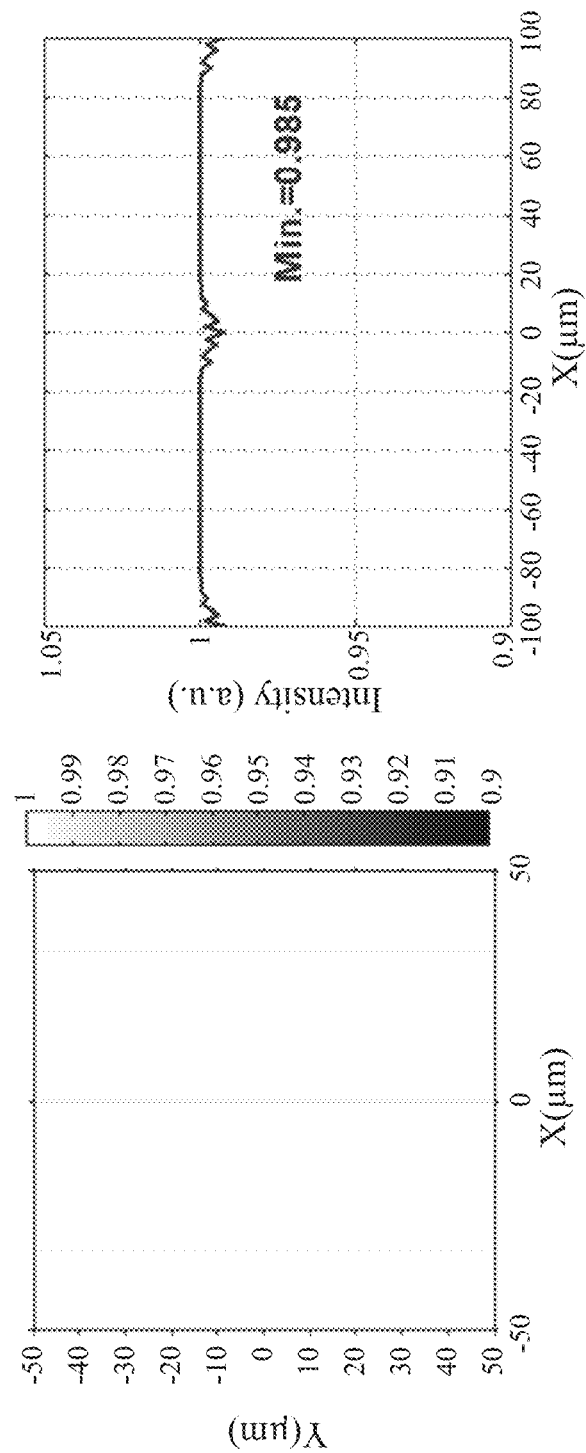
FIG. 6C is a simulation plot indicating intensity of the transmitted light of the pellicle based on the image of the pellicle on a wafer.

FIG. 6A illustrates a pellicle 600 disposed on a reticle 650, according to an embodiment of the disclosure. The pellicle 600 shown in FIG. 6A has a width of 100 nm, a pitch of 100 μm, and is disposed 1.5 mm away from the surface of the reticle 650. FIG. 6B illustrates a light source having a shape, such as a Y-oriented dipole. FIG. 6C is a simulation plot indicating intensity of the transmitted light of the pellicle 600 as a function of lateral positions x and y based on the image of the pellicle on a wafer. The transmission rate of the pellicle 600 is shown as the intensity in gray-scale. FIG. 6D is another simulation plot indicating the intensity of the transmitted light of the pellicle 600 as a function of the lateral position x.

FIG. 7A illustrates a pellicle 700 disposed on a reticle 750, according to an embodiment of the disclosure. The pellicle 700 shown in FIG. 7A has a width of 100 nm, a pitch of 10 μm, and is disposed 2.5 mm away from the surface of the reticle 750. FIG. 7B illustrates a light source having a shape, such as a Y-oriented dipole. FIG. 7C is a simulation plot indicating the intensity of the transmitted light of the pellicle 700 as a function of lateral positions x and y based on the image of the pellicle on a wafer. The transmission rate of the pellicle 700 is shown as the intensity in gray-scale. FIG. 7D is another simulation plot indicating the intensity of the transmitted light of the pellicle 700 as a function of the lateral position x.

FIG. 8A illustrates a pellicle 800 disposed on a reticle 850, according to an embodiment of the disclosure. The pellicle 800 shown in FIG. 8A has a width of 100 nm, a pitch of 10 μm, and is disposed 1.5 mm away from the surface of the reticle 850. FIG. 8B illustrates a light source having a shape, such as a X-oriented dipole. FIG. 8C is a simulation plot indicating intensity of the transmitted light of the pellicle 800 as a function of the lateral positions x and y based on the image of the pellicle on a wafer. The transmission rate of the pellicle 800 is shown as the intensity in gray-scale. FIG. 8D is another simulation plot indicating the intensity of the transmitted light of the pellicle 800 as a function of the lateral position x.

FIG. 9A illustrates a pellicle 900 disposed on a reticle 950, according to an embodiment of the disclosure. The pellicle 900 shown in FIG. 9A has a width of 100 nm, a pitch of 100 μm, and is disposed 1.5 mm away from the surface of the reticle 950. FIG. 9B illustrates a light source having a shape, such as a Y-oriented dipole. FIG. 9C is a simulation plot indicating intensity of the transmitted light of the pellicle 900 as a function of the lateral positions x and y based on the image of the pellicle on a wafer. The transmission rate of the pellicle 900 is shown as the intensity in gray-scale. FIG. 9D is another simulation plot indicating the intensity of the transmitted light of the pellicle 900 as a function of the lateral position x.

Figure 10:
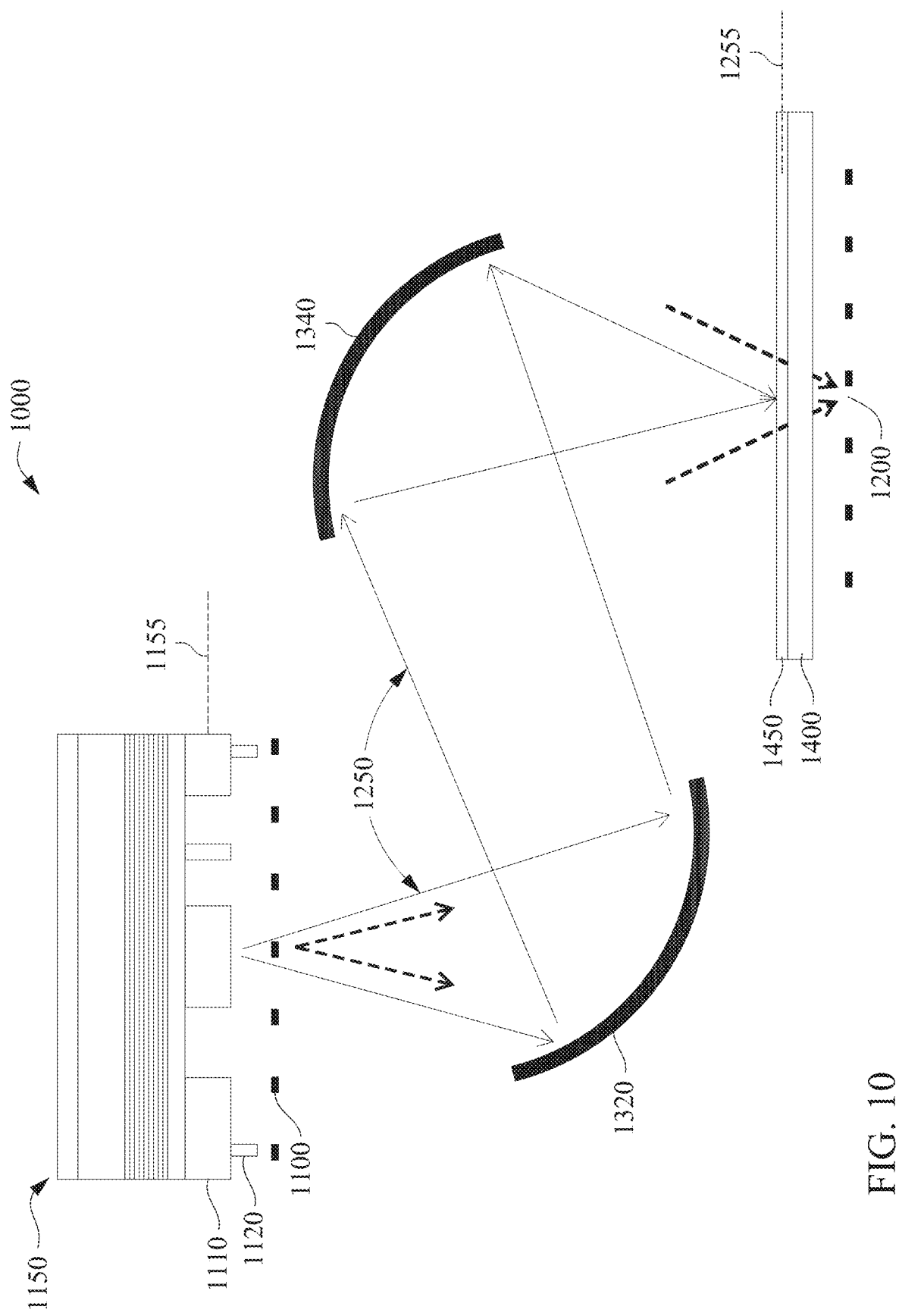
FIG. 10 illustrates an example imaging system employing a reflective mask with a pellicle, according to an embodiment of the disclosure.

FIG. 10 illustrates an imaging system 1000, according to an embodiment of the disclosure. As illustrated in FIG. 10, the imaging system 1000 includes a reflective mask 1150, which is shown upside down, compared to that of FIG. 1. The reflective mask 1150 is identical or substantially similar to the lithographic mask 150 as shown and described with respect to FIG. 1. As shown in FIG. 10, the reflective mask 1150 includes a pellicle 1100 attached to the mask 1150 via a frame 1120 on a side with patterned features. The patterned features are formed in an absorption stack 1110 disposed on the mask 1150. The pellicle 1100 is identical or substantially similar to any of the pellicles 200a, 200b, 200c, 300a, 300b, 300c, 300d, 400, 500, 600, 700, 800, and 900 as shown in FIGS. 2A, 2B, 2C, 3A, 3B, 3C, 3D, 4A, 5A, 6A, 7A, 8A, and 9A. The pellicle 1100 has a thickness between 10 nm and 100 μm and is disposed about 1 mm to about 3 mm away from the mask 1150.

In some embodiments, the pellicles 200a, 200b, 200c, 300a, 300b, 300c, 300d, 400, 500, 600, 700, 800, 900, and 1100 include nitrocellulose, cellulose easter, fluorocarbon polymer, fluoropolymers, a combination thereof, and the like. In some embodiments, the pellicles 200a, 200b, 200c, 300a, 300b, 300c, 300d, 400, 500, 600, 700, 800, 900, and 1100 include silicon. In some embodiments, common k values of natural materials having suitable chemical and/or physical properties are used as pellicle gratings. Some example materials include, but not limited to Si, Mo, TaBN, TaBO, Ru.

As illustrated in FIG. 10, the imaging system 1000 includes a set of mirrors 1320 and 1340, and a wafer 1400. The wafer 1400 has a photoresist layer 1450 disposed thereon. As shown in FIG. 10, the absorption stack 1100 has a focal plane 1155 and the patterned features at the focal plane 1155 can be transferred to the wafer 1400 at an image plane 1255, which is superimposed with the photoresist layer 1450. The patterned features of the absorption stack 1100 is transferred along an optical path 1250 via the set of mirrors 1320 and 1340 onto the photoresist layer 1450, which happens to be at the image plane 1255. In some embodiments, there are more or fewer mirrors. Therefore, any particle or contaminants disposed on the pellicle 1100 will not be transferred to the image plane 1255, but the image of the particles and contaminants will only be focused at an image of pellicle 1200. Therefore, only the features at the focal plane 1155 will be imaged on the image plane 1255.

Figure 11A:
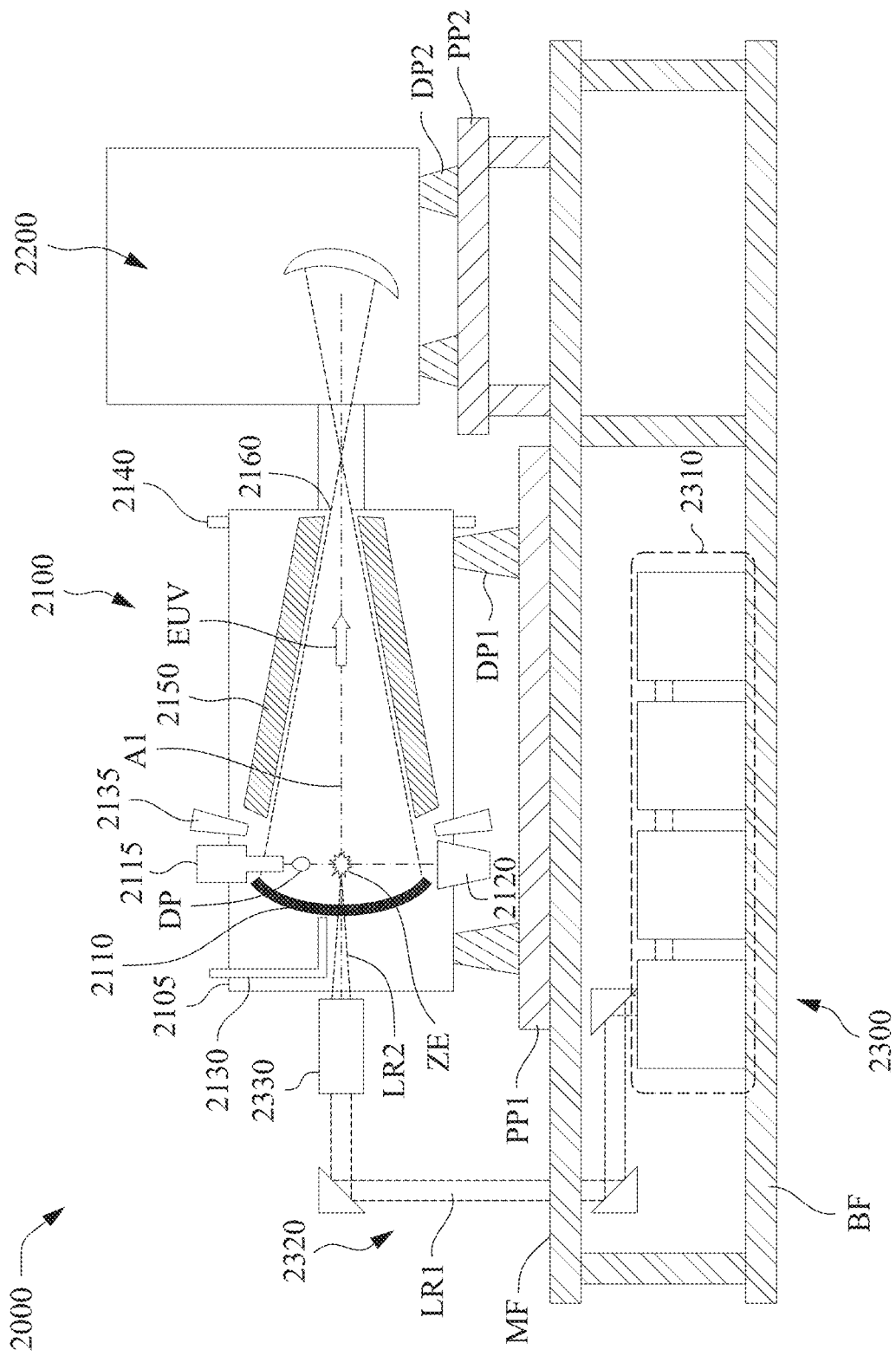
FIG. 11A is a schematic view of an EUV lithography system with a laser produced plasma (LPP) EUV radiation source, constructed in accordance with some embodiments of the present disclosure.
Figure 11B:
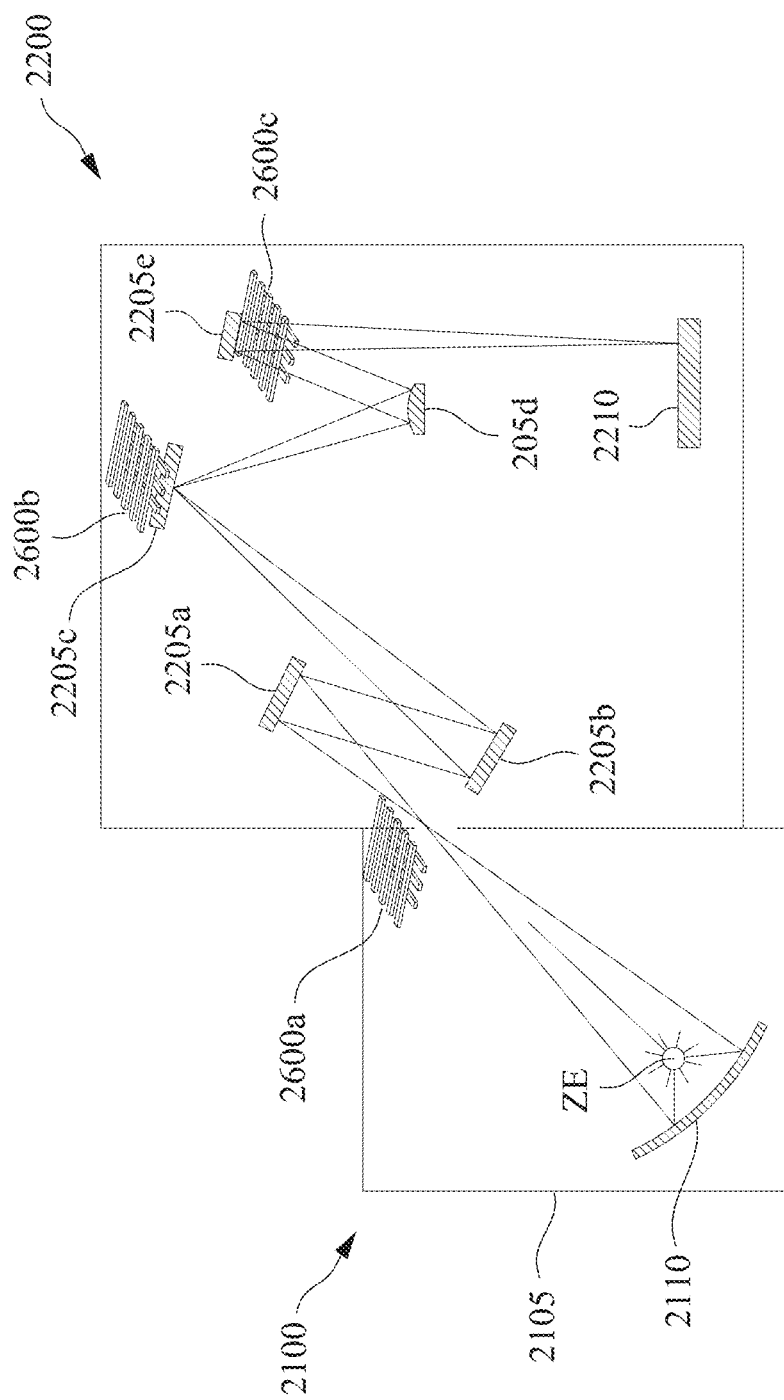
FIG. 11B is a schematic view of an EUV lithography system exposure tool according to embodiments of the disclosure.

FIGS. 11A and 11B are schematic and diagrammatic views of an EUV lithography system. As shown in FIG. 11A, the EUV lithography system 2000 (can also be referred to as lithography system or patterning system) includes an EUV radiation source apparatus 2100 to generate EUV light, an exposure tool 2200, such as a scanner, and an excitation laser source apparatus 2300. As shown in FIG. 11A, in some embodiments, the EUV radiation source apparatus 2100 and the exposure tool 2200 are installed on a main floor MF of a clean room, while the excitation source apparatus 2300 is installed in a base floor BF located under the main floor. Each of the EUV radiation source apparatus 2100 and the exposure tool 2200 are placed over pedestal plates PP1 and PP2 via dampers DP1 and DP2, respectively. The EUV radiation source apparatus 2100 and the exposure tool 2200 are coupled to each other by a coupling mechanism, which may include a focusing unit.

In one particular example, the EUV radiation source 2100 generates EUV light with a wavelength centered at about 13.5 nm. In one particular example, the EUV radiation source 2100 generates EUV light with a wavelength ranging from at about 13.4 nm to about 13.6 nm. In the present embodiment, the EUV radiation source 2100 utilizes a mechanism of laser-produced plasma (LPP) to generate the EUV radiation.

The exposure tool 2200 includes various reflective optic components, such as convex/concave/flat mirrors, a mask holding mechanism including a mask stage, and wafer holding mechanism. The EUV radiation EUV generated by the EUV radiation source 2100 is guided by the reflective optical components onto a mask secured on the mask stage. In some embodiments, the mask stage includes an electro-static chuck (e-chuck) to secure the mask. Because gas molecules absorb EUV light, the lithography system for the EUV lithography patterning is maintained in a vacuum or a low pressure environment to avoid EUV intensity loss.

FIG. 11B is a simplified schematic diagram of a detail of an extreme ultraviolet lithography tool according to an embodiment of the disclosure showing the exposure of photoresist coated substrate 2210 with a patterned beam of EUV light. The exposure device 2200 is an integrated circuit lithography tool such as a stepper, scanner, step and scan system, direct write system, device using a contact and/or proximity mask, etc., provided with one or more optics 2205a, 2205b, for example, to illuminate a patterning optic 2205c, such as a reticle, with a beam of EUV light, to produce a patterned beam, and one or more reduction projection optics 2205d, 2205e, for projecting the patterned beam onto the substrate 2210. A mechanical assembly (not shown) may be provided for generating a controlled relative movement between the substrate 2210 and patterning optic 2205c. As further shown in FIG. 11B, the EUVL tool includes an EUV light source 2100 including plasma at ZE emitting EUV light in a chamber 2105 that is collected and reflected by a collector 2110 along a path into the exposure device 2200 to irradiate the substrate 2210.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gratings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic," as used herein, is not meant to be limited to components which operate solely within one or more specific wavelength range(s) such as at the EUV output light wavelength, the irradiation laser wavelength, a wavelength suitable for metrology or any other specific wavelength.

The lithography system 2000 may further include other modules or be integrated with (or be coupled with) other modules.

As shown in FIG. 11A, the EUV radiation source 2100 includes a target droplet generator 2115 and a LPP collector 2110, enclosed by a chamber 2105. The target droplet generator 2115 generates a plurality of target droplets DP. In some embodiments, the target droplets DP are tin (Sn) droplets. In some embodiments, the tin droplets each have a diameter about 30 microns (μm). In some embodiments, the tin droplets DP are generated at a rate about 50 droplets per second and are introduced into a zone of excitation ZE at a speed about 70 meters per second (m/s). Other material can also be used for the target droplets, for example, a tin containing liquid material such as eutectic alloy containing tin or lithium (Li).

The excitation laser LR2 generated by the excitation laser source apparatus 2300 is a pulse laser. In some embodiments, the excitation layer includes a pre-heat laser and a main laser. The pre-heat laser pulse is used to heat (or pre-heat) the target droplet to create a low-density target plume, which is subsequently heated (or reheated) by the main laser pulse, generating increased emission of EUV light.

In various embodiments, the pre-heat laser pulses have a spot size about 100 μm or less, and the main laser pulses have a spot size about 200-300 μm.

The laser pulses LR2 are generated by the excitation laser source 2300. The laser source 2300 may include a laser generator 2310, laser guide optics 2320 and a focusing apparatus 2330. In some embodiments, the laser source 2310 includes a carbon dioxide ($CO_2$) or a neodymium-doped yttrium aluminum garnet (Nd:YAG) laser source.

The laser light LR1 generated by the laser generator 2300 is guided by the laser guide optics 2320 and focused into the excitation laser LR2 by the focusing apparatus 2330, and then introduced into the EUV radiation source 2100. The laser light LR2 is directed through windows (or lenses) into the zone of excitation ZE. The windows adopt a suitable material substantially transparent to the laser beams. The generation of the pulse lasers is synchronized with the generation of the target droplets. As the target droplets move through the excitation zone, the pre-pulses heat the target droplets and transform them into low-density target plumes. A delay between the pre-pulse and the main pulse is controlled to allow the target plume to form and to expand to an optimal size and geometry. When the main pulse heats the target plume, a high-temperature plasma is generated. The plasma emits EUV radiation EUV, which is collected by the collector mirror 2110. The collector 2110 has a reflection surface that reflects and focuses the EUV radiation for the lithography exposing processes. In some embodiments, a droplet catcher 2120 is installed opposite the target droplet generator 2115. The droplet catcher 2120 is used for catching excess target droplets. For example, some target droplets may be purposely missed by the laser pulses.

The collector 2110 includes a proper coating material and shape to function as a mirror for EUV collection, reflection, and focusing. In some embodiments, the collector 2110 is designed to have an ellipsoidal geometry. In some embodiments, the coating material of the collector 2100 is similar to the reflective multilayer of the EUV mask. In some examples, the coating material of the collector 2110 includes multiple layers (such as a plurality of Mo/Si film pairs) and may further include a capping layer (such as Ru) coated on the multiple layers to substantially reflect the EUV light. In some embodiments, the collector 2110 may further include a grating structure designed to effectively scatter the laser beam directed onto the collector 2110. For example, a silicon nitride layer is coated on the collector 2110 and is patterned to have a grating pattern in some embodiments.

In such an EUV radiation source apparatus, the plasma caused by the laser application creates physical debris, such as ions, gases and atoms of the droplet, as well as the desired EUV radiation. It is necessary to prevent the accumulation of material on the collector 2110 and also to prevent physical debris exiting the chamber 105 and entering the exposure tool 2200.

As shown in FIG. 11A, in some embodiments, a buffer gas is supplied from a first buffer gas supply 2130 through the aperture in collector 2110 by which the pulse laser is delivered to the tin droplets. In some embodiments, the buffer gas is $H_2$, He, Ar, $N_2$, or another inert gas. In certain embodiments, $H_2$ is used as H radicals generated by ionization of the buffer gas can be used for cleaning purposes. The buffer gas can also be provided through one or more second buffer gas supplies 2135 toward the collector 2110 and/or around the edges of the collector 2110. Further, the chamber 2105 includes one or more gas outlets 2140 so that the buffer gas is exhausted outside the chamber 2105.

Hydrogen gas has low absorption to the EUV radiation. Hydrogen gas reaching to the coating surface of the collector 2110 reacts chemically with a metal of the droplet forming a hydride, e.g., metal hydride. When tin (Sn) is used as the droplet, stannane ($SnH_4$), which is a gaseous byproduct of the EUV generation process, is formed. The gaseous $SnH_4$ is then pumped out through the outlet 2140. However, it is difficult to exhaust all gaseous $SnH_4$ from the chamber and to prevent the $SnH_4$ from entering the exposure tool 2200. To trap the $SnH_4$ or other debris, one or more debris collection mechanisms or devices 2150 are employed in the chamber 2105.

As illustrated in FIG. 11B, a pellicle structure 2600a is shown as placed beside an optical path between the collector 2110 and the optics 2205a, 2205b. Another pellicle structure 2600b is shown as placed in front of the patterning optic 2205c. In some embodiments, the pellicle structure 2600b is attached to patterning optic 2205c, such as the reticle, as shown and described with respect to FIGS. 3A, 3B, 3C, 3D, 4A, 5A, 6A, 7A, 8A, and 9A. In another embodiment, the pellicle structure 2600c is placed in an optical path in between the one or more reduction projection optics 2205d, 2205e. The pellicle structures 2600a, 2600b, and 2600c are identical or substantially similar to any of the pellicles 200a, 200b, 200c, 300a, 300b, 300c, 300d, 400, 500, 600, 700, 800, and 900.

In some embodiments, one or more of the pellicle structures 2600a, 2600b, and 2600c can be included in the EUV lithography systems and components as shown and described in FIG. 11B. In some embodiments, the pellicle structures 2600a, 2600b, and 2600c include a plurality of openings and the openings include between 5% and 99.9% of lateral surface area of the pellicle structures 2600a, 2600b, and 2600c. In some embodiments, the pellicle structures 2600a, 2600b, and 2600c have a thickness between 10 nm and 100 μm. In some embodiments, the pellicle structures 2600a, 2600b, and 2600c include a plurality of opening in the form of bar shaped materials, a honey comb structure, or a mesh structure. In some embodiments, the plurality of openings of the pellicle structures 2600a, 2600b, and 2600c have a width between 1 nm and 1 μm, and a pitch between 1 μm and 100 μm.

The disclosure includes a pellicle (sparse pellicle or sparse pellicle structure) to protect a pattern side of a lithography mask from falling particles and floating contaminants. The disclosed sparse pellicle maintains a relatively higher transmissive rate of the EUV radiation. In some embodiments, the sparse pellicle structure is formed from a material that includes gaps, spacing, or openings as opposed to existing pellicle structures that include a film or a membrane stretched over the reticle. In some example embodiments, the sparse pellicle structure is electrically charged or magnetized to improve collection of particles and contaminants. In various embodiments, the sparse pellicle is configured to provide an improved transmissive rate for EUV radiation having a wavelength of around 13.5 nm. In addition to being used as a pellicle (as part of the lithographic mask), the sparse pellicle can be used in an imaging system (e.g., in an optical system) of the EUV system to collect floating contaminants in the optical path in some embodiments.

An embodiment of the disclosure is a lithography patterning system. The system includes a reticle having patterned features, a pellicle having a plurality of openings, the pellicle configured to protect the reticle against particles and floating contaminants, a radiation source configured for emitting radiation to reflect and/or project the patterned features, and one or more mirrors configured for guiding reflected and/or projected patterned features onto a wafer. In an embodiment, the pellicle is attached to the reticle on a side of the patterned features at a distance between 1 mm and 10 mm. In an embodiment, the pellicle is placed beside an optical path between the radiation source and the wafer. In an embodiment, the one or more mirrors include at least two mirrors, wherein the pellicle is placed in an optical path between the at least two mirrors. In an embodiment, the plurality of openings in the sparse pellicle are formed by a plurality of bar shaped materials. In an embodiment, the plurality of openings in the sparse pellicle form a honey comb structure or a mesh structure. In an embodiment, the plurality of openings in the pellicle comprise up to 99.9% of lateral surface area of the pellicle. In an embodiment, the plurality of openings in the sparse pellicle include at least 5% of lateral surface area of the sparse pellicle. In an embodiment, the radiation has a wavelength between 10.0 nm and 450.0 nm. In an embodiment, the pellicle has a transmission efficiency up to 90% for radiation wavelengths ranging from about 13.4 nm to about 13.6 nm.

Another embodiment of the disclosure is a pellicle. The pellicle includes a pellicle structure having a plurality of openings, wherein the plurality of openings comprise between 5% and 99.9% of lateral surface area of the pellicle structure, and a frame for supporting the pellicle structure. In an embodiment, the pellicle structure includes a plurality of layers wherein the plurality of layers comprise at least two different materials or compositions. In an embodiment, the plurality of openings are formed by a plurality of bar shaped materials having a width between 1 nm and 1 μm, and a pitch between 1 μm and 100 μm. In an embodiment, some bar shaped materials of the plurality of bar shaped materials are electrically charged or magnetized. In an embodiment, the plurality of openings form a honey comb structure or a mesh structure. In an embodiment, the pellicle has a transmission efficiency up to 90% for radiation wavelengths ranging from 13.4 nm to 13.6 nm and centered at 13.5 nm.

Another embodiment of the disclosure is an imaging system. The imaging system includes a reflective mask having patterned features on one side of the reflective mask, at least one lens or mirror, and a pellicle having a plurality of openings disposed between the reflective mask and the at least one lens or mirror. In an embodiment, the sparse pellicle is attached on the side the reflective mask having the patterned features. In an embodiment, the plurality of openings are formed by a plurality of bar shaped materials having a width between 1 nm and 1 µm, and a pitch between 1 µm and 100 µm. In an embodiment, the plurality of openings include between 5% and 99.9% of lateral surface area of the pellicle.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography patterning system, comprising:
   a reticle having patterned features;
   a pellicle having a plurality of openings defined by a plurality of bar shaped materials, the pellicle configured to protect the reticle against particles and floating contaminants;
   a radiation source configured for emitting radiation to reflect and/or project the patterned features; and
   one or more mirrors configured for guiding reflected and/or projected patterned features onto a wafer,
   wherein each of the plurality of bar shaped materials is parallel to the other, and each of the plurality of bar shaped materials extends across a length of the pellicle.

2. The system of claim 1, wherein the pellicle is attached to the reticle on a side of the patterned features at a distance between 1 mm and 10 mm.

3. The system of claim 1, wherein the pellicle is placed beside an optical path between the radiation source and the wafer.

4. The system of claim 1, the one or more mirrors include at least two mirrors, wherein the pellicle is placed in an optical path between the at least two mirrors.

5. The system of claim 1, wherein the radiation has a wavelength between 10.0 nm and 450.0 nm.

6. The system of claim 1, wherein the pellicle has a transmission efficiency up to 90% for radiation wavelengths ranging from 13.4 nm to 13.6 nm.

7. The system of claim 1, wherein some of the bar shaped materials of the plurality of bar shaped materials are magnetized.

8. The system of claim 1, wherein the pellicle has two layers of the plurality of bar shaped materials.

9. A pellicle comprising:
   a pellicle structure having a plurality of openings defined by a plurality of bar shaped materials, wherein the plurality of openings comprise between 5% and 99.9% of lateral surface area of the pellicle structure; and
   a frame for supporting the pellicle structure,
   wherein each of the plurality of bar shaped materials is parallel to the other, and each of the plurality of bar shaped materials extends across a length of the pellicle.

10. The pellicle of claim 9, wherein the pellicle structure comprises a plurality of layers wherein the plurality of layers comprise at least two different materials or compositions.

11. The pellicle of claim 9, wherein each of the plurality of bar shaped materials has a width between 1 nm and 1 µm, and a pitch between 1 µm and 100 µm.

12. The pellicle of claim 11, wherein some of the bar shaped materials of the plurality of bar shaped materials are electrically charged or magnetized.

13. The pellicle of claim 9, wherein the pellicle has a transmission efficiency up to 90% for radiation wavelengths ranging from 13.4 nm to 13.6 nm.

14. The pellicle of claim 9, wherein some of the bar shaped materials of the plurality of bar shaped materials are magnetized.

15. The pellicle of claim 9, wherein the pellicle has two layers of the plurality of bar shaped materials.

16. An imaging system, comprising:
   a reflective mask having patterned features on one side of the reflective mask;
   at least one lens or mirror; and
   a pellicle having a plurality of openings disposed between the reflective mask and the at least one lens or mirror,
   wherein the plurality of openings are defined by a plurality of bar shaped materials, each of the plurality of bar shaped materials is parallel to the other, and each of the plurality of bar shaped materials extends across a length of the pellicle.

17. The imaging system of claim 16, wherein the pellicle is attached on the side the reflective mask having the patterned features.

18. The imaging system of claim 16, wherein each of the plurality of bar shaped materials has a width between 1 nm and 1 µm, and a pitch between 1 µm and 100 µm.

19. The imaging system of claim 16, wherein some of the bar shaped materials of the plurality of bar shaped materials are magnetized.

20. The imaging system of claim 16, wherein the pellicle has two layers of the plurality of bar shaped materials.

* * * * *